Dec. 20, 1955

N. N. EPSTEIN 2,727,993

STABILIZED OSCILLATOR

Filed April 7, 1953

INVENTOR.
NORMAN N. EPSTEIN

BY Lippincott & Smith

ATTORNEYS

United States Patent Office 2,727,993

Patented Dec. 20, 1955

2,727,993

STABILIZED OSCILLATOR

Norman N. Epstein, Redwood City, Calif., assignor to Lenkurt Electric Co., Inc., San Carlos, Calif., a corporation of Delaware Application April 7, 1953, Serial No. 347,242

9 Claims. (Cl. 250—36)

The present invention relates in general to oscillators, and in particular to fixed frequency oscillators having provisions for automatically maintaining the output thereof at a desired level.

Broadly stated, the oscillator of this invention comprises an amplifying element having an anode, a cathode and a control electrode in combination with a circuit comprising a T network, the series arm of which is a parallel-resonant (or "anti-resonant") circuit connecting the anode and the control electrode, and the shunt arm includes a high Q frequency determining element exhibiting series-resonant properties, preferably a piezoelectric crystal, connecting the series arm and the cathode. Amplitude or output level stability is obtained by an element having a negative coefficient of resistance coupled to draw energy from the series arm of the network. Anode current is supplied through a parallel connection, and output from the oscillator is taken off either from the anode or the control electrode end of the parallel-resonant circuit.

This arrangement has features in common with certain known types of oscillators. Thus, if the shunt path in the frequency-selective network (i. e., the path including the crystal) be shorted out the circuit degenerates substantially into the well-known Hartley oscillator.

Further, oscillators have been used employing either bridged T or twin T networks as frequency-determining elements. In such amplifiers, however, double feedback paths have been used, one path being regenerative, the other degenerative. The T network is employed in the latter path because of its "null" characteristic; i. e., when properly designed its transfer constant and consequently the degenerative feedback, become zero at one frequency only, and the oscillator stabilizes at this frequency. Amplitude, however, varies with supply voltages and with load, and additional circuit elements have been required where accurate amplitude control was necessary.

In general, to obtain amplitude stability, regulated power supplies, constant loading, with a buffer amplifier between the oscillator and the load to achieve this, nonlinear resistance elements coupled into the circuit in various more or less complicated ways, or combinations of these have been used. While fully justified for the purposes of laboratory standards the complexity and expense of these expedients has made them inappropriate for many commercial applications. Moreover, where pure sine wave-form has been required, it has ordinarily necessitated reducing the drive or regenerative feedback to a point which will barely maintain oscillation which is undesirable where reliability of continuous operation is needed.

Among the objects of this invention are to provide an oscillator circuit which has a high degree of frequency stability, a high degree of amplitude stability and ample drive, and at the same time requires a minimum number of circuit elements and delivers good wave-form.

Other objects and purposes of the present invention will be evident from the following detailed description thereof when viewed in the light of the accompanying drawing wherein.

Figure 1:
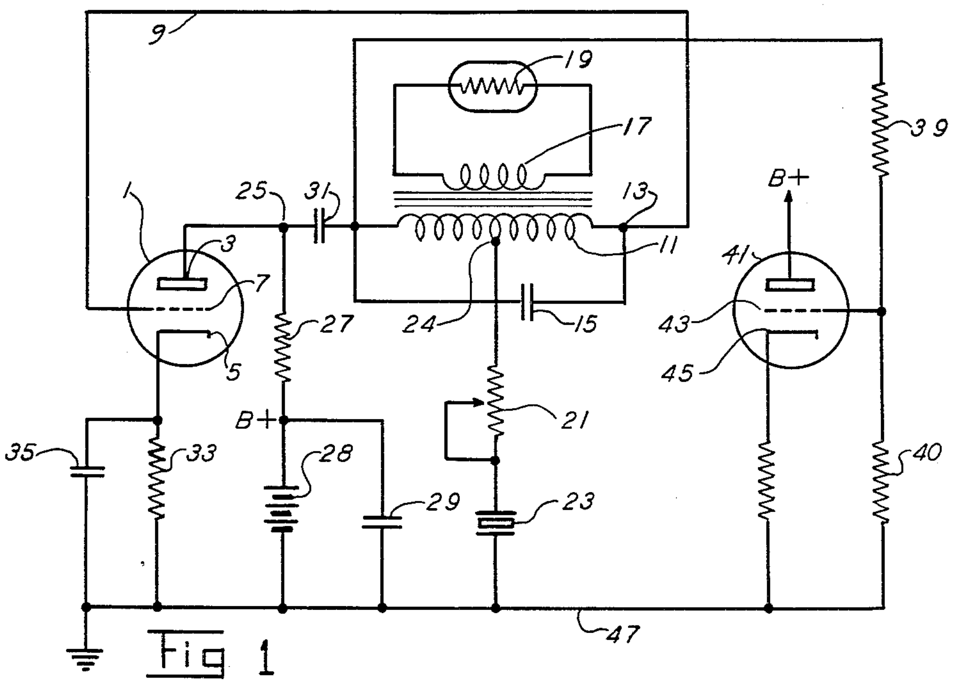
Fig. 1 is a representative circuit diagram of an oscillator in accordance with the present invention.

In Fig. 1 an amplifier element shown as triode 1 is provided with an anode 3, cathode 5 and control electrode 7, a feedback path 9 between the anode 3 and control electrode 7 being provided in order that conventional feedback oscillator principles may obtain in the circuit of the present invention. An oscillatory path is shown in the form of a bridged T-network wherein the series arm of the T comprises a parallel tuned circuit, one branch constituting a primary winding 11 of a bridge transformer 13 with a capacitor 15 in the other branch connected thereacross. An output winding 17 of the bridge transformer 13 supplies current to an impedance 19 having a negative coefficient of resistance such as a thermistor or resistor of "Thyrite," the current through the impedance 19 being determined in accordance with the magnitude of circulating current flowing in the parallel tuned circuit. The shunt arm of the T-network comprises an adjustable resistor 21 in series with a frequency determining unit of series resonant character shown as the crystal 23, the unit 23 and resistor 21 preferably being tapped into the primary winding 11 at the electrical midpoint thereof. Exact balance is not essential, however, although it will usually lead to optimum operation. When so connected the potentials of the anode and control electrode are equal and opposite with respect to the junction with the shunt arm at the point 24.

Anode voltage is supplied through a parallel circuit connecting the point 25 through a resistive (or inductive) impedance 27, the anode supply 28 being bypassed, as is conventional, by a condenser 29. A blocking condenser 31 keeps the anode potential off of the grid, which is biased through a cathode resistor 33 and bypass condenser 35. Grid bias is supplied through a high resistance voltage divider comprising resistors 39 and 40. The divider is shown as connecting from the anode end of the coil 11, as this permits the drive for an output tube 41 to be readily connected from the portion of the circuit where the output voltage is most stable, with its control electrode 43 connected to the divider and its cathode 45 to ground.

The method of coupling the output tube shown is only one of several that may be used, however. For example, the succeeding tube may be driven either directly or through a coupling transformer, or from the grid end of the transformer 13, although this latter arrangement does not give quite such accurate control. Such modifications are well known and as they do not affect the theory of operation of the circuit their illustration is believed unnecessary.

As is well understood, the conditions for self sustaining oscillation of an amplifying circuit are that the control electrode or grid must swing 180° out of phase with the anode with respect to the cathode, and the product of the amplification times the fraction of the output voltage fed back must be unity. The oscillator will operate at the frequency at which the first condition holds, and the ocillations will build up in amplitude until the losses in the circuit (including the power absorbed in the load) so drop the potential of the anode oscillation that the second condition obtains.

High frequency stability requires that slight deviations from the norm in frequency produce large changes in phase. High inherent amplitude stability requires that slight changes in amplitude produce relatively large changes in circuit losses.

In the present circuit it is evident that the grid end of the series arm of the network must swing 180° out of phase with the anode with respect to the junction 24 with the shunt arm. If the latter be shorted out the phase condition for oscillation as between anode and grid will always obtain, and the frequency of oscillation will be determined by the resonant frequency of the parallel tuned circuit being that at which the amplitude of the grid and plate swings is greatest.

With the introduction of a finite impedance in the shunt arm an additional factor enters; if the impedance introduced is a pure resistance the voltage drops between the junction 24 and the cathode and grid respectively will be in the same phase, since at resonance the impedance of the series arm is purely resistive. As the resistance of the shunt arm is increased a point is reached where the two drops become equal, there is no grid swing with respect to the cathode and hence no feedback and no oscillation. This is the null condition of the network which obtains when the impedance of the series arm is four times that of the shunt arm. Any further increase in shunt impedance results in negative or degenerative feedback.

With shunt resistances of less than this critical value oscillation will still occur at a frequency determined by the resonance of the tuned circuit. Under this condition the frequency stability would be poor, owing to the damping introduced by the load imposed by the element 19. This makes the Q of the circuit low, broadens out the response curve of the circuit and reduces its changes, from purely resistive to capacitive or inductive with small deviations of frequency. It also reduces the ability of the series arm to discriminate against harmonics.

The introduction of the crystal 23 changes this situation. The crystal operates at its series mode, resonant at substantially the frequency of parallel resonance of the series arm. At the series-resonant frequency its impedance approaches zero, and if the resistance of element 21 is small the grid and anode potential relationships become those of the Hartley oscillator, discussed above; they swing in opposite phase with respect to the cathode regardless of the tuning of the series arm, although the amplitude of the swings is affected by the tuning. The Q of the crystal being very high—2000 or more—very slight deviations from resonance cause it to appear as a substantially pure reactance of large magnitude. The 180° relationship between grid and anode no longer obtains, and oscillation therefore will not occur at the deviated frequency.

Introducing a finite resistance 21 does not change the phase relationship as long as its value is less than the critical value at which the grid and cathode oscillation of potentials become equal. Increasing the resistance varies the amplitude of the grid oscillation with respect to the cathode and therefore the energy of the oscillation, but not the frequency. It can be shown that while the introduction of this resistance reduces the phase angle of the drop between the junction 24 and the cathode when frequency deviations occur it actually increases the deviation of the phase angle between anode and grid with respect to the cathode from the 180° value and therefore improves frequency stability somewhat.

The potential differences between the point 24 and the cathode and control electrode respectively are in the same direction. If the two are equal the control electrode and the cathode will be at the same potential; if the drop across the shunt arm is less than that across one-half of the series arm the anode and control electrode will be at opposite potentials with respect to the cathode, which is the necessary condition for oscillation; if the drop across the series arm is the greater the grid potential is applied degeneratively. How far the grid must be driven regeneratively to maintain oscillation depends on the losses in the circuit.

In past T network oscillators the series arm constituted the frequency-determining element of the system. The introduction of damping into the series arm not only affects the resonant frequency but broadens the peak of its resonance curve and reduces its height. Increasing the resistance in the shunt arm then narrows the frequency band wherein the grid potential is of the proper phase to maintain oscillation, but it does this by reducing the amplitude of the grid swing and hence the vigor of the oscillation.

In the present oscillator the primary frequency-determining element is not the series arm of the network, but the crystal in the shunt arm. Owing to the extremely high Q of the crystal its impedance, while very low at its resonant frequency, becomes high at very slight departures therefrom. Changes in frequency therefore have a much greater effect on the apparent impedance of the shunt arm than they do on the series arm of the network, and frequency deviations too small to affect materially the potential drop in the series arm will raise the impedance of the shunt arm to so high a value that the potentials applied to the grid are degenerative. The resistor 21 in the shunt arm is no longer necessary to provide frequency stability, but becomes purely an adjustment of amplitude. The circuit will oscillate strongly at the series resonant mode of the crystal even if the tuning of the series arm is only approximate.

Because of this frequency stability the amplitude corrector, comprising the thermistor or other negative coefficient device 19 may be coupled directly to the series arm, in the secondary of the transformer 13. The turn ratio of the secondary 17 can be chosen with respect to the impedance of element 19 at a desired operating point to provide the required excitation to maintain it at that point under average tube and power supply conditions. Thus, if "Thyrite" be used as the negative coefficient device its coefficient of resistance varies as the voltage across it, increase in amplitude of oscillation increases the current through it, tending to drop the voltage and thus limit the change to a very small value. Thermistors secure the same effect indirectly through a negative variation of resistance with temperature. The two devices are here equivalents, but when a thermistor is used (as will hereinafter be assumed) preferably the operating temperature will be well above ambient, to minimize the effect of changes in the latter. Final adjustment of operating point may be made by adjusting resistor 21.

With operating conditions thus chosen, any changes which tend to vary the output level are largely self-correcting. Thus, for example, an increase in anode voltage, which would tend to raise the level of the oscillations generated, will tend to increase the voltage across the element 19, and by increasing the current therethrough raise its temperature, decrease its resistance, and thus cause a further increase in current. This effects a drop in the oscillating potential applied to the grid 7, and a consequent decrease in the amplitude of the oscillations generated, restoring the original level to within a very close approximation. A drop in anode voltage, a decrease in the amplification constant of the tube, or anything else tending to reduce the output level will have an opposite effect.

The change in impedance of the secondary circuit will change the apparent inductance of the primary circuit 11 to some extent and hence the resonant frequency of the series arm of the network. Because of the factor discussed above, however, this does not have any material effect on the frequency, which is held constant by the crystal in the shunt arm.

The level of most stable operation may be chosen with regard to the availability of tubes and negative coefficient elements, and the optimum driving potential for the amplifier tube 41 may be chosen, as desired by picking off from the proper point on the voltage divider 39—40.

The advantages of the arrangement over conventional frequency and level stabilized oscillators are apparent. Primary among these are the simplicity of the circuit and the minimum number of elements comprising it. The crystal and the tuned tank circuit are required in any frequency stabilized oscillator. The only additional elements necessary are the secondary coil 17 coupled to the tank circuit and the thermistor or equivalent device 19. Even the variable resistor 21 may be omitted if elements 19 of sufficient uniformity are available; the resistor merely adds an extra degree of flexibility to the design.

It will be recognized that there are several modifications of the T-network which are substantially equivalent electrically. The element 19 may be directly connected across all or part of the inductor in the series arm. The shunt arm may be connected between a pair of condensers in series, constituting the capacity branch of the series arm. The element 19 may be connected across one of a plurality of capacities in the series arm. All such modifications and their equivalents are so well understood that it is not believed necessary to illustrate them or discuss them in detail.

Figure 2:
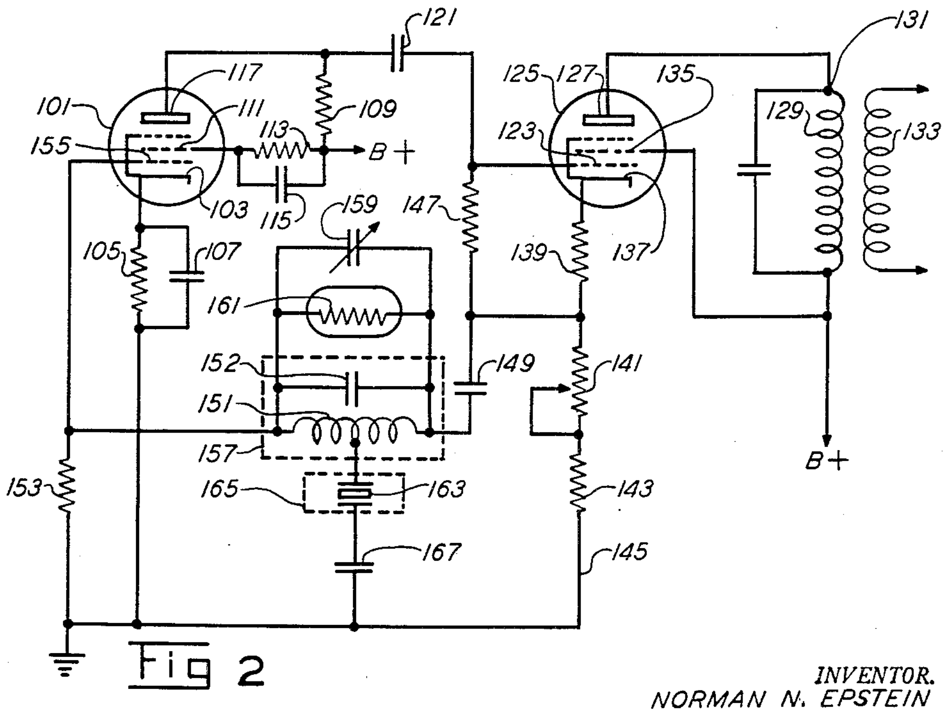
Fig. 2 is a circuit diagram of a modified form of the invention.

The circuit described above illustrates the principles of the invention as applied in perhaps their simplest form. It may be desirable for operational, rather than theoretical reasons, such as obtaining more power, or the utilization of tubes having specific output characteristics, to modify the circuit arrangement while still retaining the frequency and amplitude stability of the fundamental circuit. A circuit in which this is accomplished is illustrated in Fig. 2.

In this case the oscillator tube 101 is a pentode, having the high gain and high plate impedance characteristic of tubes of this type. It is self-biased, its cathode 103 connecting to ground through a resistor 105 shunted by a bypass condenser 107. Anode potential is supplied through a source (not shown) connected at B+ and feeding the anode through a resistor 109. Bias potential for the screen grid 111 is supplied from the same source through a resistor 113 which is also shunted by a bypass condenser 115.

The anode 117 connects, through a blocking condenser 121, to the grid 123 of a second pentode 125. The anode 127 of the second pentode connects to the tuned primary 129 of a transformer 131; the secondary 133 connects to the load which the device is intended to supply. The anode 127 and screen grid 135 of the pentode are supplied in parallel from the common anode source as indicated at B+.

The cathode 137 of tube 125 connects through a chain of resistors 139, 141 and 143 to ground through a lead 145. A grid resistor 147 connects from the grid 123 to the junction between resistors 139 and 141, resistor 139 being of proper value so that the drop across it is sufficient to maintain the cathode within its proper operating range positive to the grid.

The feedback circuit also connects to the junction between resistors 139 and 141 through a blocking condenser 149. The feedback and stabilizing circuit is identical in principle with that described in connection with the first figure, although it differs in detail. It comprises a center tapped inductor 151, one end of which is connected to the blocking condenser 149 and the other to a resistor 153 which in turn connects to ground. The grid 155 of tube 101 connects to the ungrounded end of this latter resistor.

The inductor 151 is condenser tuned to substantially the operating frequency of the device. In the particular piece of apparatus shown, which is intended for quantity manufacture, this tuning is accomplished by means of a fixed condenser 152 which is mounted in a common shield 157 with the inductor. Fine tuning is accomplished by means of a variable trimmer condenser 159, and in this case the nonlinear impedance 161 of "Thyrite" as bridged directly across the inductor instead of being supplied through a separate secondary coil. A crystal 163 connects to the center tap of the inductor 151. The crystal is mounted in an oven, indicated by the dotted lines 165. The crystal connects, through a condenser 167 with ground. It should be noted that the value of this latter condenser is critical; in practice the condensers used for this purpose are carefully matched to the crystals with which they are associated and marked with the same serial number. The reason for this will be considered in detail hereinafter.

It will be remembered from the theoretical discussion of the circuit given above that the frequency stability of the arrangement depends upon the fact that the two ends of the series arm of the bridged-T circuit always swing in precisely opposite phase with respect to the center tap and that this is the correct phase to maintain oscillation only when the shunt arm containing the crystal is at series resonance. In the form of the circuit first described one end of the T connected directly to the anode. In order that the grid may swing precisely out of phase with the anode, however, a direct connection at the other end to the anode is not necessary; it is sufficient if this other end swings in phase with the anode.

This is accomplished by the connection shown. It will be seen that as far as the frequency-determining circuit is concerned tube 125 is connected as a cathode follower. The negative feedback through the cathode resistors is sufficient to insure that the phase rotation between the grid 123 and the cathode 137 is substantially nil, but even without this the high anode impedance of the tube and the purely resistive cathode circuit (at least at resonance of the T network) would insure substantially this result. The T circuit therefore acts precisely as though it were directly connected with the anode and hence the same principles obtain as have already been discussed.

The voltage gain of the cathode-follower circuit may be anything less than unity; it is adjustable by varying the value of resistor 141. The drive on the grid 155 can thus be varied at will; no variable resistor is therefore needed in the series arm of the T. Variation of the cathode impedance also affects the energy supplied to the nonlinear resistor 161, and the impedance of the latter can therefore be matched and its operating point selected without the necessity of a separate secondary winding. At the same time tube 125 supplies ample output energy and its load does not react upon the operation of the circuit.

The shunt arm of the frequency determining circuit operates, as before, at series resonance. The condenser 167 is used to adjust finally the exact frequency at which series resonance occurs, being in series with the effective series capacity of the crystal itself and thereby raising its frequency. A condenser is not necessary if the frequency to which the crystal is ground be exact, but the use of the condenser is convenient where many oscillators are to be manufactured as it permits greater tolerance in the selection of crystals.

On test the two embodiments of the device that have been described have shown substantially identical characteristics as far as both frequency and amplitude stability are concerned. Amplitude remains constant to a fraction of one percent. On long continuous tests the frequency variation was less than one part in $10^7$, the variation being substantially that to be expected of the crystal and its oven, with no indication that change in temperature, supply voltage, or any other factor affecting the circuit parameters other than the series resonance frequency of the crystal and its trimmer themselves had any measurable effect.

What is claimed is:

1. An oscillator stabilized with respect to frequency and amplitude comprising an amplifying element having an anode, a cathode, and a control electrode, a T-network comprising a parallel-resonant series arm having one terminal connected to vary in potential in phase with said anode and the other end connected to said control electrode and a shunt arm including frequency-determining means series-resonant at substantially the resonant frequency of said series arm connecting the latter to said cathode, and a resistor having a negative coefficient of resistance coupled effectively in parallel with said series arm.

2. An oscillator as defined in claim 1 wherein said one terminal of said series arm is connected to said anode.

3. An oscillator as defined in claim 1 including a second amplifying element having an anode, a cathode and a control electrode, connections from the anode of said first mentioned amplifying element to drive the control electrode of said second amplifying element in phase therewith, and cathode-follower connections from said second amplifying element to said series arm.

4. An oscillator stabilized with respect to frequency and amplitude comprising an amplifying element having an anode, a cathode and a control electrode, a T-network comprising a parallel resonant series arm having one terminal connected to vary in potential in phase with said anode and the other terminal connected to said control electrode, and a series-resonant shunt arm connected to said cathode and including a crystal resonant at substantially the frequency of said series arm, and a resistor having a negative resistance characteristic coupled effectively in parallel with said series arm.

5. An oscillator stabilized with respect to frequency and amplitude comprising an amplifying element having an anode, a cathode and a control electrode, a T-network comprising a parallel resonant series arm having one terminal connected to vary in potential in phase with said anode and the other terminal connected to said control electrode, and a series-resonant shunt arm connected to said cathode and including a crystal resonant at substantially the frequency of said series arm, a resistor having a negative resistance characteristic coupled effectively in parallel with said series arm and means for varying the oscillating potential with respect to said cathode applied to said control electrode through said series arm.

6. An oscillator as defined in claim 5 wherein said last-mentioned means comprises a variable resistor in said shunt arm.

7. An oscillator as defined in claim 5 wherein said last-mentioned means comprises a variable resistor connecting said first-mentioned terminal of said series arm and said cathode.

8. An oscillator as defined in claim 5 including a second amplifying element having an anode, a cathode and a control electrode, connections for driving said last-mentioned control electrode in phase with the anode of said first mentioned amplifying element, and a resistor connected between the cathodes of said amplifying elements to connect the second thereof a cathode follower, said series element being connected to said resistor to receive driving potential therefrom.

9. An oscillator as defined in claim 8 including a load circuit connected to the anode of said second amplifying element.

References Cited in the file of this patent

UNITED STATES PATENTS

| | | |
|---|---|---|
| 2,163,403 | Meachan | June 20, 1939 |
| 2,453,435 | Havstad | Nov. 9, 1948 |
| 2,459,842 | Royden | Jan. 25, 1949 |